(12) United States Patent
Chen et al.

(10) Patent No.: US 12,313,679 B2
(45) Date of Patent: May 27, 2025

(54) LEAKAGE TESTING STRUCTURE AND LEAKAGE TESTING METHOD

(71) Applicant: CANSEMI TECHNOLOGY INC., Guangdong (CN)

(72) Inventors: Zeyong Chen, Guangdong (CN); Zhengliang Zhou, Guangdong (CN)

(73) Assignee: CANSEMI TECHNOLOGY INC., Guangdong (CN)

( * ) Notice: Subject to any disclaimer, the term of this patent is extended or adjusted under 35 U.S.C. 154(b) by 10 days.

(21) Appl. No.: 18/575,713

(22) PCT Filed: Jan. 29, 2022

(86) PCT No.: PCT/CN2022/075073
§ 371 (c)(1),
(2) Date: Dec. 29, 2023

(87) PCT Pub. No.: WO2023/273343
PCT Pub. Date: Jan. 5, 2023

(65) Prior Publication Data
US 2024/0319267 A1 Sep. 26, 2024

(30) Foreign Application Priority Data
Jun. 30, 2021 (CN) .......................... 202110731413.7

(51) Int. Cl.
*G01R 31/30* (2006.01)
(52) U.S. Cl.
CPC .................. *G01R 31/3008* (2013.01)
(58) Field of Classification Search
CPC ............... G01R 31/26; G01R 31/2642; G01R 31/2648; G01R 31/2831; G01R 31/31702
See application file for complete search history.

(56) References Cited

U.S. PATENT DOCUMENTS

| 5,913,106 A * | 6/1999 | Hause ..................... H01L 22/34 438/18 |
| 6,249,138 B1 * | 6/2001 | Huang ............... G01R 31/2648 324/762.08 |

(Continued)

FOREIGN PATENT DOCUMENTS

| CN | 1548969 A | 11/2004 |
| CN | 1549321 A | 11/2004 |

(Continued)

*Primary Examiner* — Tung X Nguyen
(74) *Attorney, Agent, or Firm* — Muncy, Geissler, Olds & Lowe, P.C.

(57) ABSTRACT

An electrical leakage test structure and an electrical leakage testing method are disclosed. The electrical leakage test structure comprises: a substrate; a first well region and a second well region, which are both formed in the substrate; a first shallow trench isolation structure formed between the second and first well regions; a first source/drain region formed in the first well region; a plurality of second source/drain regions formed in the second well region; and a test gate formed on the substrate. In the electrical leakage testing method, a plurality of electrical leakage test structures with different designed dimensions are tested to perform leakage current evaluation on each electrical leakage test structure, and a designed dimension vs. leakage current relationship is developed based on the leakage current evaluation on each electrical leakage test structure, which reflects whether the internal design of a corresponding semiconductor device is associated with any problem such as parasitic leakage.

7 Claims, 3 Drawing Sheets

(56) References Cited

U.S. PATENT DOCUMENTS

| | | | | |
|---|---|---|---|---|
| 7,298,159 B1 * | 11/2007 | Rozario | ............ | G01R 31/2623 |
| | | | | 324/762.01 |
| 2009/0014718 A1 | 1/2009 | Hong | | |

FOREIGN PATENT DOCUMENTS

| CN | 101083264 A | 12/2007 |
|---|---|---|
| CN | 101335210 A | 12/2008 |
| CN | 105489503 A | 4/2016 |
| CN | 108878304 A | 11/2018 |
| CN | 108878402 A | 11/2018 |
| CN | 109786328 A | 5/2019 |
| CN | 113257790 A | 8/2021 |

* cited by examiner

LEAKAGE TESTING STRUCTURE AND LEAKAGE TESTING METHOD

TECHNICAL FIELD

The present invention relates to the field of integrated circuit (IC) fabrication and, in particular, to an electrical leakage test structure and an electrical leakage testing method.

BACKGROUND

In the field of semiconductor technology, during the development of an IC design or a process platform for a semiconductor device, it is necessary to use a variety of electrical leakage test structures to verify whether the circuit design or process can work correctly. Different electrical leakage test structures can be used to assess different device properties, and the results can serve as a basis for improving the circuit design or process. For semiconductor devices, electrical leakage, especially parasitic leakage, is an issue that cannot be neglected.

For electrical leakage testing of semiconductor devices, the leakage test structure shown in FIG. 1 is commonly used (by many manufacturers), the leakage test structure includes: a semiconductor substrate 10; a well region 20 in the semiconductor substrate 10; a shallow trench isolation structure 30 in the well region 20, a source region 40 and a drain region 50 in the well region 20, the source region 40 and the drain region 50 are located on opposite sides of the shallow trench isolation structure 30; and a gate 60 on the semiconductor substrate, the gate 60 covers the shallow trench isolation structure 30. This electrical leakage test structure can only test parasitic leakage between the gate 60 and the shallow trench isolation structure 30, which can only reflect a leakage current occurring as a result of conductivity-type inversion of the shallow trench isolation structure 30 caused by a voltage applied to the gate 60. However, it cannot be used to identify parasitic leakage or other issues caused by the internal design of a semiconductor device.

SUMMARY OF THE INVENTION

It is an objective of the present invention to provide an electrical leakage test structure and an electrical leakage testing method, which overcome the problem associated with existing electrical leakage test structures of being unable to reflect parasitic leakage and other problems associated with the internal design of a semiconductor device.

To this end, the present invention provides an electrical leakage test structure including a substrate, in which a first well region of a first conductivity type and a second well region of a second conductivity type are formed, wherein the first well region is adjacent to the second well region, and the second conductivity type is opposite to the first conductivity type; a first shallow trench isolation structure, which is formed between the first well region and the second well region and isolates the first well region from the second well region; a first source/drain region of the first conductivity type formed in the first well region; a plurality of second source/drain regions of the first conductivity type formed in the second well region and spaced apart at intervals in a first direction, wherein the plurality of second source/drain regions and the first source/drain region are formed on opposing sides of the first shallow trench isolation structure; and a test gate formed in the substrate, the test gate extending in a second direction and covering at least part of the first source/drain region and one of the second source/drain regions, wherein the second direction is perpendicular to the first direction.

Optionally, the electrical leakage test structure may further include a second shallow trench isolation structure formed in the second well region and a third source/drain region of the second conductivity type also formed in the second well region, wherein the third source/drain region is isolated from the plurality of second source/drain regions by the second shallow trench isolation structure.

Optionally, the electrical leakage test structure may further include a plurality of contact structures formed respectively on the first source/drain region, the plurality of second source/drain regions, the third source/drain region and the test gate.

Optionally, in the electrical leakage test structure, the first conductivity type may be n-type and the second conductivity type may be p-type. Alternatively, the first conductivity type may be p-type and the second conductivity type may be n-type.

Based on the same inventive concept, the present invention further includes: providing a plurality of electrical leakage test structures as defined above, which have different designed dimensions; and testing each of the electrical leakage test structures to perform leakage current evaluation on each electrical leakage test structure and developing a designed dimension vs. leakage current relationship based on the leakage current evaluation on each electrical leakage test structure.

Optionally, in the electrical leakage testing method, the designed dimensions of the electrical leakage test structures may include a first width and a second width of the first shallow trench isolation structure in each electrical leakage test structure, wherein the first width is a distance from a side of the first shallow trench isolation structure closer to the first source/drain region to the second well region; the second width is a distance from a side of the first shallow trench isolation structure closer to the second source/drain regions to the first well region; the first shallow trench isolation structures in the plurality of electrical leakage test structures have distinct first widths and distinct second widths; and the first shallow trench isolation structures in the plurality of electrical leakage test structures have equal total widths, which are the sums of the respective first widths and the respective second widths. The designed dimensions of the electrical leakage test structures may further include a pitch interval between adjacent second source/drain regions in each electrical leakage test structure, wherein the plurality of electrical leakage test structures have distinct pitch intervals between adjacent second source/drain regions.

Optionally, in the electrical leakage testing method, the leakage current evaluation on each electrical leakage test structure may involve a first leakage current and a second leakage current, wherein the first leakage current is a leakage current possibly occurring between the first well region and the second well region in each electrical leakage test structure, and the second leakage current is a leakage current possibly occurring between adjacent second source/drain regions in each electrical leakage test structure.

Optionally, in the electrical leakage testing method, the step of testing each electrical leakage test structure may include a first leakage current evaluation test performed on each electrical leakage test structure, which includes: applying a first voltage to the test gate in each electrical leakage test structure, a second voltage to the first source/drain region in each electrical leakage test structure and a third voltage to one of the second source/drain regions in each electrical leakage test structure, responsively checking the presence of the first leakage current in each electrical leakage test structure, and developing a relationship between the first and second widths and the first leakage current based on the presence of the first leakage current in each electrical leakage test structure.

Optionally, in the electrical leakage testing method, the step of testing each electrical leakage test structure may include a second leakage current evaluation test performed on each electrical leakage test structure, which includes: applying a first voltage to the test gate in each electrical leakage test structure and second and third voltages respectively to adjacent two of the second source/drain regions in each electrical leakage test structure, responsively checking the presence of the second leakage current in each electrical leakage test structure, and developing a relationship between the pitch interval between adjacent second source/drain regions in each electrical leakage test structure and the second leakage current based on the presence of the second leakage current in each electrical leakage test structure.

Optionally, testing each electrical leakage test structure may include keeping the second and third voltages constant, incrementing or decrementing the first voltage by a fixed step within a predetermined voltage range and checking the presence of the first or second leakage current in each electrical leakage test structure at each first voltage value, or may include keeping the first voltage constant, incrementing or decrementing the second voltage and/or the third voltage by fixed step(s) within predetermined voltage range(s) and checking the presence of the first or second leakage current in each electrical leakage test structure at each second and/or third voltage value.

The present invention provides an electrical leakage test structure and an electrical leakage testing method. The electrical leakage test structure includes: a substrate; a first well region and a second well region, which are both formed in the substrate; a first shallow trench isolation structure formed between the second and first well regions; a first source/drain region formed in the first well region; a plurality of second source/drain regions formed in the second well region; and a test gate formed on the substrate. In the electrical leakage testing method, a plurality of electrical leakage test structures with different designed dimensions are tested to perform leakage current evaluation on each electrical leakage test structure, and a designed dimension vs. leakage current relationship is developed based on the leakage current evaluation on each electrical leakage test structure, which reflects whether the internal design of a corresponding semiconductor device is associated with any problem such as parasitic leakage.

In these figures: 10—semiconductor substrate; 20—well region; 30—shallow trench isolation structure; 40—source region; 50—drain region; 60—gate; 100—substrate; 110—first well region; 110a—first active area; 120a—second active area; 120b—third active area; 120—second well region; 130—first shallow trench isolation structure; 140—first source/drain region; 150, 150a, 150b—second source/drain region; 160—test gate; 170—third source/drain region; 180—second shallow trench isolation structure; 190—contact structure.

DETAILED DESCRIPTION

Electrical leakage test structures and methods provided in embodiments of the present invention will be described in greater detail below with reference to the accompanying drawings. From the following description, advantages and features of the invention will become more apparent. Note that the figures are provided in a very simplified form not necessarily drawn to exact scale and for the only purpose of facilitating easy and clear description of the disclosed embodiments.

Figure 1:
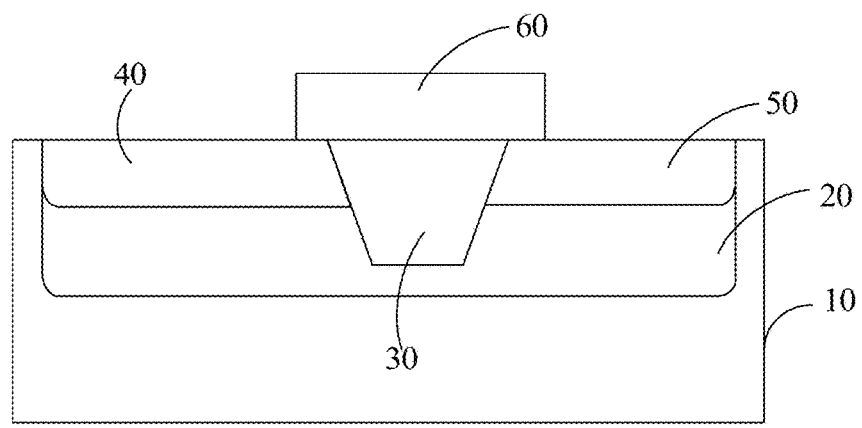
FIG. 1 is a schematic illustration of a conventional electrical leakage test structure.
Figure 2:
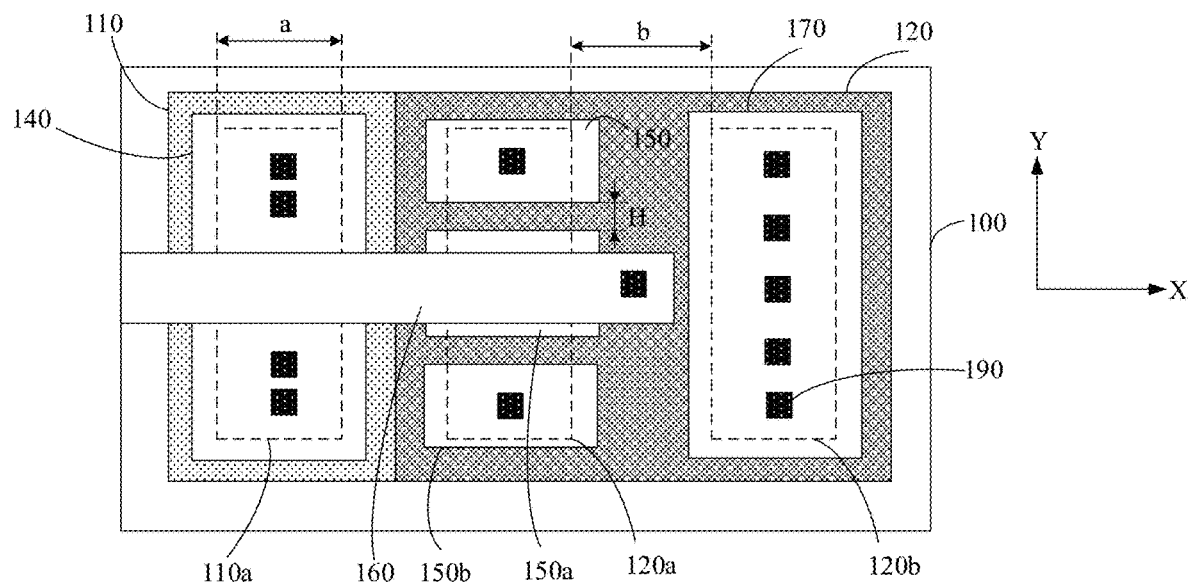
FIGS. 2 and 3 are top views of an electrical leakage test structure according to an embodiment of the present invention.
Figure 3:
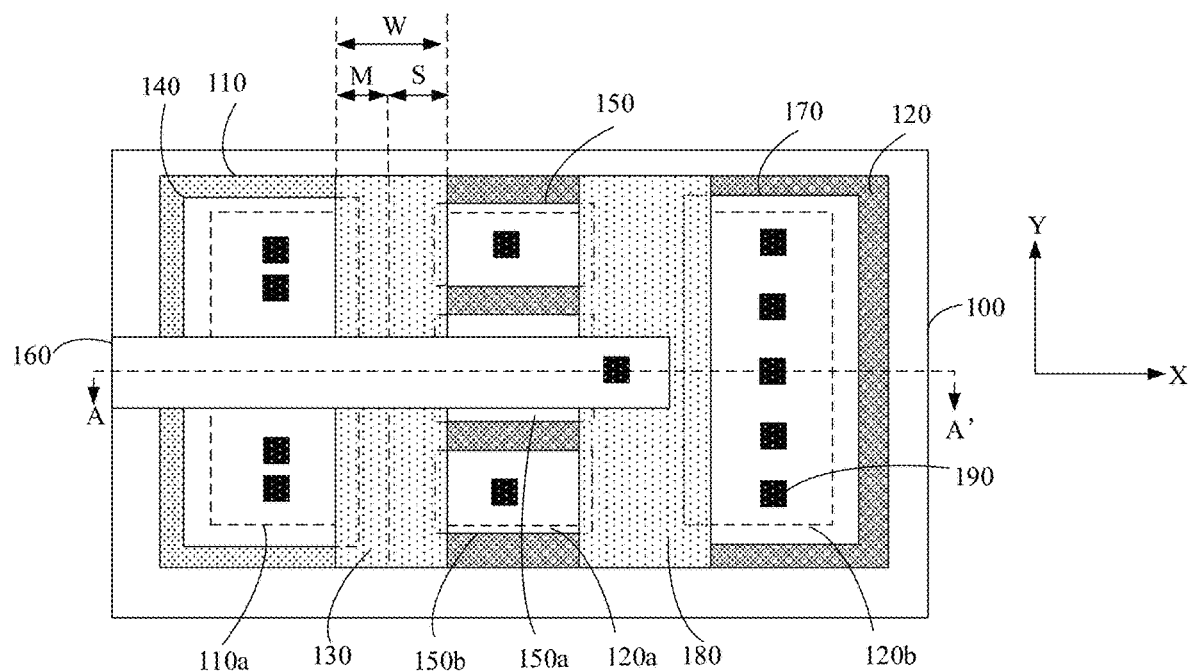
Figure 4:
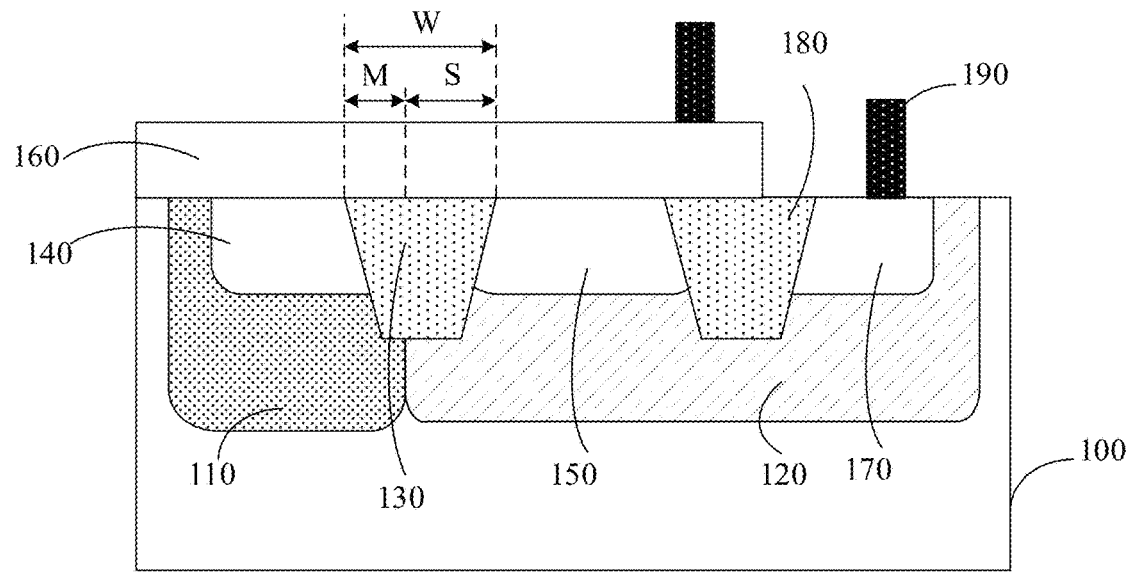
FIG. 4 is a schematic cross-sectional view of FIG. 3 taken along line A-A'.

FIGS. 2 and 3 are top views of an electrical leakage test structure according to an embodiment of the present invention. FIG. 4 is a schematic cross-sectional view of FIG. 3 taken along line A-A'. Referring to FIGS. 2 to 4, the present invention provides an electrical leakage test structure, the electrical leakage test structure includes a substrate 100, a first shallow trench isolation structure 130, a first source/drain region 140 of a first conductivity type, a plurality of second source/drain regions 150, 150a, 150b of the first conductivity type and a test gate 160.

In the substrate 100 are formed a first well region 110 of the first conductivity type and a second well region 120 of a second conductivity type. The first well region 110 is adjacent to the second well region 120, and the second conductivity type is opposite to the first conductivity type. Active areas are defined in both the first well region 110 and the second well region 120. For example, a first active area 110a may be defined in the first well region 100, and a second active area 120a and a third active area 120c may be defined in the second well region 120. The first active area 110a may have a width a of 0.5 μm to 2 μm, and widths of the second active area 120a and the third active area 120b may be the same as the width a of the first active area 110a. The second active area 120a and the third active area 120b may be separated by a distance of 0.5 μm to 1 μm.

The first shallow trench isolation structure 130 is formed between the first well region 110 and the second well region 120 and isolates the first well region 110 from the second well region 120. The first source/drain region 140 of the first conductivity type is formed in the first well region 110. The plurality of second source/drain regions 150, 150a, 150b of the first conductivity type are formed in the second well region 120 and spaced apart at intervals in a first direction Y. The plurality of second source/drain regions 150, 150a, 150b and the first source/drain region 140 are formed on opposite sides of the first shallow trench isolation structure 130. Here, by "plurality of second source/drain regions", it is intended to mean that there are three or more second source/drain regions. The test gate 160 is formed on the substrate 100. It extends in a second direction X and covers at least part of the first source/drain region 140 and one of the second source/drain regions. The second direction X is perpendicular to the first direction Y.

This electrical leakage test structure can directly detect the presence of a leakage current between the first well region 110 and the second well region 120. That is, the electrical leakage test structure can be used to ascertain whether the second well region 120 will be inverted in conductivity type when a voltage is applied to the first source/drain region 140. Thus, it can identify channel leakage caused by conductivity-type inversion of the second well region 120. The test electrical leakage test structure can also detect the presence of a leakage current between adjacent second source/drain regions and thereby ascertain the impact of the distance between the adjacent second source/drain regions on such a leakage current.

The electrical leakage test structure may be formed in a test area of a wafer at the same time as the formation of an associated semiconductor device in a functional area of the wafer. The first well region 110, the second well region 120, the first source/drain region 140, the plurality of second source/drain regions 150, 150a, 150b and the first shallow trench isolation structure 130 in the electrical leakage test structure may be formed simultaneously with respective components of the semiconductor device in the functional area. In this way, the first well region 110, the second well region 120, the first source/drain region 140, the plurality of second source/drain regions 150, 150a, 150b and the first shallow trench isolation structure 130 may have the same parameters as the respective components of the semiconductor device. In this way, electrical leakage conditions in the electrical leakage test structure can reflect parasitic leakage currents and other problems with the semiconductor device. Here, the semiconductor device may be a metal-oxide-semiconductor (MOS) device.

In this embodiment, the first conductivity type may be n-type, and the second conductivity type may be p-type. In other embodiments of the present invention, the first conductivity type may be p-type, while the second conductivity type may be n-type.

The first well region 110 may contain n-type dopant ions, and the second well region 120 may contain p-type dopant ions. In other embodiments of the present invention, the first well region 110 may contain p-type dopant ions, and the second well region 120 may contain n-type dopant ions. The second well region 120 is isolated from the first well region 110 by the first shallow trench isolation structure 130. The first shallow trench isolation structure 130 extends from a surface of the substrate 100 into the substrate 100.

In this embodiment, the electrical leakage test structure further includes a second shallow trench isolation structure 180 formed in the second well region 120 and a third source/drain region 170 of the second conductivity type formed in the second well region 120. The third source/drain region 170 is isolated from the plurality of second source/drain regions 150, 150a, 150b by the second shallow trench isolation structure 180. The third source/drain region 170 contains p-type dopant ions. In other embodiments of the present invention, the third source/drain region 170 may contain n-type dopant ions. Both the first shallow trench isolation structure 130 and the second shallow trench isolation structure 180 may be made of insulating materials such as silicon oxide.

In this embodiment, an NMOS transistor may be formed in the first well region 110, and a PMOS transistor may be formed in the second well region 120. The first source/drain region 140 may serve as a source or drain region of the NMOS transistor, and the second source/drain regions 150, 150a, 150b may serve as source regions of the PMOS transistor. Moreover, the third source/drain region 170 may serve as a drain region of the PMOS transistor. In other embodiments of the present invention, the second source/drain regions 150, 150a, 150b may serve as drain regions of the PMOS transistor, and the third source/drain region 170 may serve as a source region of the PMOS transistor. That is, the source and drain regions of the PMOS transistor are interchangeable, without affecting the benefits of particular implementations of the present invention.

In this embodiment, the test gate 160 may be doped polysilicon. However, the present invention is not so limited, because in other embodiments of the invention, the test gate 160 may be alternatively made of a metal.

With continued reference to FIGS. 2 to 4, the electrical leakage test structure further includes a plurality of contact structures 190, the plurality of contact structures 190 are scattered in the first well region 110, the second well region 120, the first source/drain region 140, the plurality of second source/drain regions 150, 150a, 150b, the third source/drain region 170 and the test gate 160. Electrical connections may be established with the first source/drain region 140, the plurality of second source/drain regions 150, 150a, 150b, the third source/drain region 170 or the test gate 160 through the contact structures 190. That is, voltages may be applied to the first source/drain region 140, the plurality of second source/drain regions 150, 150a, 150b, the third source/drain region 170 or the test gate 160 through the contact structures 190 in order to test the presence of any leakage current in the electrical leakage test structure, for example, between the first well region 110 and the second well region 120.

The electrical leakage test structure of this embodiment can be used to test electrical leakage in a MOS device and analyze the influence of leakage-related parasitic effects on the MOS device, thereby enabling better, more effective analysis of leakage-related problems with the MOS device.

Figure 5:
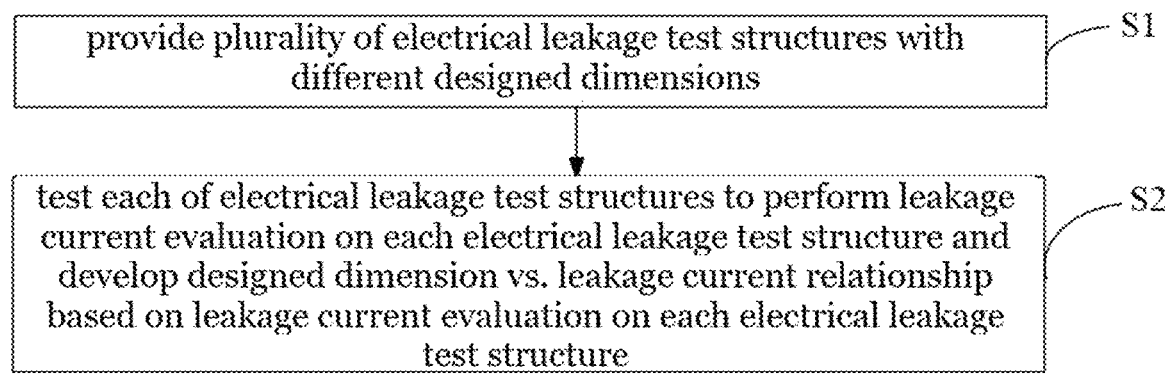
FIG. 5 is a flowchart of an electrical leakage testing method according to an embodiment of the present invention.

Based on the same inventive concept, in embodiments of the present invention, there is also provided an electrical leakage testing method. Referring to FIG. 5, the electrical leakage testing method includes the steps of: in step S1, providing a plurality of electrical leakage test structures with different designed dimensions; and in step S2, testing each of the electrical leakage test structures to perform leakage current evaluation on the electrical leakage test structures, and based on the leakage current evaluation on the electrical leakage test structures, developing a designed dimension vs. leakage current relationship for the electrical leakage test structures.

In step S1, with continued reference to FIGS. 2 to 4, the electrical leakage test structures with different designed dimensions are provided. The designed dimensions of each electrical leakage test structure include a first width M and a second width S of the first shallow trench isolation structure 130 in the electrical leakage test structure. The first width M represents a distance from the side of the first shallow trench isolation structure 130 closer to the first source/drain region 140 to the second well region 120, and the second width S represents a distance from the side of the first shallow trench isolation structure closer to the second source/drain regions 150, 150a, 150b to the first well region 110. The first width M and the second width S may be, for example, both range from 100 nm to 150 nm, and the first width M and the second width S may be equal to each other.

Moreover, the first shallow trench isolation structures 130 in the plurality of electrical leakage test structures have distinct first widths M and second widths S in order to investigate the influence of the first width M and the second width S on a first leakage current. The first shallow trench isolation structures 130 in the plurality of electrical leakage test structures may have equal total widths W, which are the sums of the respective first widths M and the respective second widths S. That is, for each electrical leakage test structure, the total width W of the first shallow trench isolation structure 130 is the distance between the first active area 110a and the second active area 110b.

The designed dimensions of each electrical leakage test structure further include a pitch interval H between adjacent second source/drain regions in the electrical leakage test structure. The electrical leakage test structures have distinct pitch intervals H between adjacent second source/drain regions in order to investigate the influence of the pitch interval H between adjacent second source/drain regions on a second leakage current.

In step S2, each of the electrical leakage test structures are tested to perform leakage current evaluation on the electrical leakage test structures, and based on the leakage current evaluation on the electrical leakage test structures, a designed dimension vs. leakage current relationship for the electrical leakage test structures is developed. The leakage current evaluation on the electrical leakage test structures involves the first leakage current between the first well region 110 and the second well region 120 and the second leakage current between adjacent second source/drain regions (e.g., between the second source/drain regions 150 and 150a).

Preferably, the first and second leakage currents that may be present in the electrical leakage test structures are tested in separate steps. That is, two separate steps are performed respectively for the first and second leakage currents. This can avoid crosstalk between the tests and thereby achieve accurate evaluation on the first and second leakage currents. In other words, for each electrical leakage test structure, a first leakage current evaluation test is first performed, and a second leakage current evaluation test is then carried out.

Specifically, the first and second leakage current evaluation tests for the electrical leakage test structures may be conducted in the manner as detailed below. At first, the first leakage current evaluation test may be performed, which may involve applying a first voltage to the test gate 160 in each electrical leakage test structure, a second voltage to the first source/drain region 140 in each electrical leakage test structure and a third voltage to one of the second source/drain regions 150 in each electrical leakage test structure and recording the presence of the first leakage current in each electrical leakage test structure. Moreover, a relationship between the first and second widths M, S and the first leakage current is developed based on the presence of the first leakage current in each electrical leakage test structure. That is, with the second voltage being applied to the first well region 110 through the first source/drain region 140 and the third voltage being applied to the second well region 120 through the second source/drain region, whether a leakage current is present between the first well region 110 and the second well region 120 is checked to ascertain whether the internal design of the semiconductor device is associated with any problem such as parasitic leakage.

The presence of a leakage current between the first well region 110 and the second well region 120 is related to the first width M and the second width S of the first shallow trench isolation structure 130. Therefore, in this embodiment, through testing the presence of the first leakage current in the plurality of electrical leakage test structures having distinct first widths M and second widths S of their first shallow trench isolation structures 130, it is possible to develop an accurate relationship between the first widths M and second widths S of the first shallow trench isolation structure 30 and the first leakage current.

In this embodiment, the first voltage is applied to the test gate 160 through a contact structure 190 formed on the test gate 160, the second voltage is applied to the first source/drain region 140 through a contact structure 190 formed on the first source/drain region 140, and third voltage is applied to the second source/drain region 150, 150a, 150b through a contact structure 190 formed on the second source/drain region 150, 150a, 150b.

After that, the second leakage current evaluation test may be performed, which may involve applying a first voltage to the test gate 160 in each electrical leakage test structure and second and third voltages respectively to adjacent two of the second source/drain regions in each electrical leakage test structure. For example, the second voltage may be applied to the second source/drain region 150, and the third voltage may be applied to the second source/drain region 150a. In response, the presence of the second leakage current in each electrical leakage test structure may be recorded. Moreover, a relationship between the pitch interval H between adjacent second source/drain regions and the second leakage current is developed based on the presence of the second leakage current in each electrical leakage test structure.

The pitch interval H between adjacent second source/drain regions may affect the presence of a leakage current between these two second source/drain regions. Therefore, in this embodiment, through testing the electrical leakage test structures having distinct pitch intervals, it is possible to develop an accurate relationship between the pitch interval H between adjacent second source/drain regions and the second leakage current, which reflect parasitic leakage in the semiconductor device. In addition, based on the presence of the second leakage current, it is possible to determine whether there is an abnormality, such as a short circuit, in the semiconductor device. If the pitch interval between adjacent two of the second source/drain regions is too small, a short circuit may occur between the two adjacent second source/drain regions, leading to a significant leakage current.

During the testing of each electrical leakage test structure, i.e., in the first and second leakage current evaluation tests, the first voltage may be incremented or decremented by a fixed step within a predetermined voltage range, with the second and third voltages being kept constant, and the presence of the first or second leakage current in each electrical leakage test structure may be evaluated at the series of first voltage values. For example, the first voltage may stepwise be incremented from 0 V to 10 V, and the absolute values of the first and second voltages may be equal to or smaller than 10 V. The second voltage may be, for example, 5 V, and the third voltage may be, for example, in the range of −1 V to 5 V. The first voltage may be incremented in the range of 0-10 V by a fixed step such as 0.2 V. In other particular embodiments, the step may range from 0.4 V to 0.5 V. A smaller value of the step enables more detailed data to be obtained from the leakage current evaluation tests, which is more helpful in troubleshooting any detected electrical leakage. However, the present invention is not so limited, as the first, second and third voltages may be appropriately configured based on intended performance parameters of the semiconductor device corresponding to the electrical leakage test structures.

In another implementation, during the testing of each electrical leakage test structure, i.e., in the first and second leakage current evaluation tests, the first voltage may be kept constant, while the second voltage and/or the third voltage may be incremented or decremented within a predetermined voltage range by fixed step(s), and the presence of the first or second leakage current in each electrical leakage test structure may be evaluated at the series of voltage values. Thus, leakage evaluation on the electrical leakage test structures may be conducted at various values of the first, second and third voltages. For example, the first voltage may be incremented or decremented within the range of 0-10 V, and the second voltage and/or the third voltage may be each incremented or decremented within the range of 0-5 V. However, the present invention is not so limited, as the first, second and third voltages may be appropriately configured based on intended performance parameters of the semiconductor device corresponding to the electrical leakage test structures. In other embodiments of the present invention, other electrical performance parameters may be tested by appropriately configuring the first, second and third voltages to obtain more test data and hence more accurate test results.

In the first and second leakage current evaluation tests, a zero voltage may be applied to the third source/drain region 170 in each electrical leakage test structure through a contact structure 190 formed on the third source/drain region 170. That is, the third source/drain region 170 may be grounded. In other embodiments of the present invention, the third source/drain region 170 may not be connected.

In other embodiments, the first and second leakage current evaluation tests may be performed on each electrical leakage test structure in a single step by simultaneously applying voltages to the first source/drain region 140 and the plurality of second source/drain regions 150, 150a, 150b. In this way, the number of test steps can be reduced, resulting in time savings.

The electrical leakage testing method may be used to test electrical leakage in a MOS device to determine whether the internal design of the MOS device is associated with any problem such as parasitic leakage.

In summary, embodiments of the present invention provide an electrical leakage test structure and an electrical leakage testing method. The electrical leakage test structure includes: a substrate; a first well region and a second well region, which are both formed in the substrate; a first shallow trench isolation structure formed between the second and first well regions; a first source/drain region formed in the first well region; a plurality of second source/drain regions formed in the second well region; and a test gate formed on the substrate. In the electrical leakage testing method, a plurality of electrical leakage test structures with different designed dimensions are tested to perform leakage current evaluation on each electrical leakage test structure, and a designed dimension vs. leakage current relationship is developed based on the leakage current evaluation on each electrical leakage test structure, which reflects whether the internal design of a corresponding semiconductor device is associated with any problem such as parasitic leakage.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. An electrical leakage testing method, comprising:
providing a plurality of electrical leakage test structures having different designed dimensions; wherein each of the plurality of electrical leakage test structures comprises:
a substrate, in which a first well region of a first conductivity type and a second well region of a second conductivity type are formed, wherein the first well region is adjacent to the second well region, and the second conductivity type is opposite to the first conductivity type;
a first shallow trench isolation structure, which is formed between the first well region and the second well region and isolates the first well region from the second well region;
a first source/drain region of the first conductivity type formed in the first well region;
a plurality of second source/drain regions of the first conductivity type formed in the second well region and spaced apart at intervals in a first direction, wherein the plurality of second source/drain regions and the first source/drain region are formed on opposing sides of the first shallow trench isolation structure; and
a test gate formed on the substrate, the test gate extending in a second direction and covering at least part of the first source/drain region and one of the second source/drain regions, wherein the second direction is perpendicular to the first direction, wherein the designed dimensions of the electrical leakage test structures comprise a first width and a second width of the first shallow trench isolation structure in each electrical leakage test structure, wherein the first width is a distance from a side of the first shallow trench isolation structure closer to the first source/drain region to the second well region; the second width is a distance from a side of the first shallow trench isolation structure closer to the second source/drain regions to the first well region; the first shallow trench isolation structures in the plurality of electrical leakage test structures have distinct first widths and distinct second widths; and the first shallow trench isolation structures in the plurality of electrical leakage test structures have equal total widths, which are the sums of the respective first widths and the respective second widths; and
testing each of the electrical leakage test structures to perform leakage current evaluation on each electrical leakage test structure and obtaining a relationship between a designed dimension and a leakage current of each electrical leakage test structure based on the leakage current evaluation on each electrical leakage test structure.

2. The electrical leakage testing method of claim 1, wherein the designed dimensions of the electrical leakage test structures further comprise a pitch interval between adjacent second source/drain regions in each electrical leakage test structure, wherein the plurality of electrical leakage test structures have distinct pitch intervals between adjacent second source/drain regions.

3. The electrical leakage testing method of claim 1, wherein the leakage current evaluation on each electrical leakage test structure comprises a first leakage current and a second leakage current, wherein the first leakage current is a leakage current possibly occurring between the first well region and the second well region in each electrical leakage test structure; and the second leakage current is a leakage current possibly occurring between adjacent second source/drain regions in each electrical leakage test structure.

4. The electrical leakage testing method of claim 3, wherein the step of testing each electrical leakage test structure comprises a first leakage current evaluation test performed on each electrical leakage test structure, which comprises:
applying a first voltage to the test gate in each electrical leakage test structure, a second voltage to the first source/drain region in each electrical leakage test structure and a third voltage to one of the second source/ drain regions in each electrical leakage test structure, responsively checking the presence of the first leakage current in each electrical leakage test structure, and developing a relationship between the first and second widths and the first leakage current based on the presence of the first leakage current in each electrical leakage test structure.

5. The electrical leakage testing method of claim 4, wherein the step of testing each electrical leakage test structure comprises a second leakage current evaluation test performed on each electrical leakage test structure, which comprises:

applying a first voltage to the test gate in each electrical leakage test structure and second and third voltages respectively to adjacent two of the second source/drain regions in each electrical leakage test structure, responsively checking the presence of the second leakage current in each electrical leakage test structure, and obtaining a relationship between the pitch interval between adjacent second source/drain regions in each electrical leakage test structure and the second leakage current based on the presence of the second leakage current in each electrical leakage test structure.

6. The electrical leakage testing method of claim 4, wherein testing each electrical leakage test structure comprises keeping the second and third voltages constant, incrementing or decrementing the first voltage by a fixed step within a predetermined voltage range and checking the presence of the first or second leakage current in each electrical leakage test structure at each first voltage value, or comprises keeping the first voltage constant, incrementing or decrementing the second voltage and/or the third voltage by fixed step(s) within predetermined voltage range(s) and checking the presence of the first or second leakage current in each electrical leakage test structure at each second and/or third voltage value.

7. The electrical leakage testing method of claim 5, wherein testing each electrical leakage test structure comprises keeping the second and third voltages constant, incrementing or decrementing the first voltage by a fixed step within a predetermined voltage range and checking the presence of the first or second leakage current in each electrical leakage test structure at each first voltage value, or comprises keeping the first voltage constant, incrementing or decrementing the second voltage and/or the third voltage by fixed step(s) within predetermined voltage range(s) and checking the presence of the first or second leakage current in each electrical leakage test structure at each second and/or third voltage value.

* * * * *